United States Patent
Cho et al.

[11] Patent Number: 5,936,896
[45] Date of Patent: Aug. 10, 1999

[54] HIGH SPEED AND LOW POWER SIGNAL LINE DRIVER AND SEMICONDUCTOR MEMORY DEVICE USING THE SAME

[75] Inventors: Il-jae Cho, Suwon; Jin-man Han, Seoul, both of Rep. of Korea

[73] Assignee: Samsung Electronics, Co., Ltd., Suwon, Rep. of Korea

[21] Appl. No.: 09/079,835

[22] Filed: May 15, 1998

[30] Foreign Application Priority Data

May 16, 1997 [KR] Rep. of Korea ...................... 97-19024

[51] Int. Cl.$^6$ ...................................... G11C 7/00
[52] U.S. Cl. ................................ 365/189.11; 365/189.05; 327/108
[58] Field of Search .................. 365/189.11, 189.05, 365/189.06; 327/108

[56] References Cited

U.S. PATENT DOCUMENTS

| | | | |
|---|---|---|---|
| 5,512,854 | 4/1996 | Park | 327/108 |
| 5,627,487 | 5/1997 | Keeth | 327/112 |
| 5,708,608 | 1/1998 | Park et al. | 365/189.11 |
| 5,812,010 | 9/1998 | Houk | 327/108 |
| 5,831,458 | 11/1998 | Nakagawa | 327/108 |

FOREIGN PATENT DOCUMENTS

| | | |
|---|---|---|
| 91400162 | 7/1991 | European Pat. Off. . |
| 8410616 | 6/1985 | United Kingdom . |

*Primary Examiner*—Son T. Dinh
*Attorney, Agent, or Firm*—Marger Johnson & McCollom, P.C.

[57] ABSTRACT

A signal line driver operating at high speed and consuming low power and a semiconductor memory device employing the same are disclosed. The signal line driver includes one or more first pull-up transistors, one or more second pull-up transistors, and one or more pull-down transistors. The first pull-up transistor is connected between an external power supply terminal and an output terminal and responds to a first control signal which swings between an internal power supply voltage and a ground voltage. The external power supply terminal receives an external power supply having a voltage level higher than the voltage level of the internal power supply. The first pull-up transistor provides an output signal to the output terminal having the voltage level of the internal power supply voltage minus a predetermined voltage drop. The second pull-up transistor is connected between the internal power supply voltage terminal and the output terminal. The internal power supply terminal receives the internal power supply. The second pull-up transistor increases the voltage level of the output signal to the voltage level of the internal power supply responsive to a second control signal. The pull-down transistor is connected between the output terminal and the ground voltage. The pull-down transistor provides a ground voltage to the output terminal responsive to a third control signal. The semiconductor memory device includes an input buffer, an output buffer, a data input/output line write driver, an input/output line write driver, a data input/output line read driver, and a memory cell array. At least one of the drivers for the semiconductor memory device includes the signal line driver described above.

36 Claims, 5 Drawing Sheets

HIGH SPEED AND LOW POWER SIGNAL LINE DRIVER AND SEMICONDUCTOR MEMORY DEVICE USING THE SAME

BACKGROUND OF THE INVENTION

1. Field of the Invention

The present invention relates to a semiconductor memory device, and more particularly, to a signal line driving circuit and a semiconductor memory device employing the same.

2. Description of the Related Art

The speed and integration of semiconductor memory devices have been steadily increasing over the past few years. With the increasing use of battery operated systems such as notebook computers, the need for semiconductor memory devices which consume minimal power has also increased. Usually, the semiconductor memory device includes an internal power supply voltage generator for low voltage operation and low power consumption. The internal power supply voltage generator receives an externally supplied power supply and generates an internal power supply having a voltage level that is lower than the voltage level of the externally supplied power supply. Accordingly, the internal power supply voltage is used to operate the main circuit of the semiconductor memory device thereby reducing power consumption. However, in a high speed multi-bit semiconductor memory device having a multiplicity of data input/output pins, the power consumption of the internal power supply voltage generator greatly increases. In the semiconductor memory device, power is mainly consumed in the write path and in the read path. The write path includes the data input buffer, the data input/output line write driver, the data input/output line, the input/output line write driver, the input/output line, the column select line, and the bitline. The read path includes the bitline, the column select line, the input/output line, the data input/output line read driver, the data input/output line, and the data output buffer. A substantial amount of power is consumed by the data input/output line write driver, the input/output line write driver and the data input/output line read driver which drive signal lines which are long and have a high load.

The multi-bit semiconductor memory device having a multiplicity of data input/output pins, and thus a plurality of data input/output lines and input/output lines which are simultaneously driven during write or read operation, has an increased number of data input/output line write drivers, input/output line write drivers, and data input/output line read drivers which leads to increased power consumption. Also, in a high speed multi-bit synchronous DRAM, the external power supply voltage is used to power the drivers in order to increase the operating speed of the device. Doing so, however, increases power consumption.

SUMMARY OF THE INVENTION

It is an object of the present invention to overcome the disadvantages associated with prior art signal line drivers.

It is another object of the present invention to provide a signal line driver circuit having a high operating speed and consuming low power for driving a signal line such as a data input/output line and an input/output line of a semiconductor memory device, the signal line having a long length and a high load.

Accordingly, a signal line driver for driving a signal line connected to an output terminal in a semiconductor memory device is provided. The signal line driver comprises a first pull-up transistor connected between an external power supply terminal and the output terminal for providing an output signal to the output terminal responsive to a first control signal, the external power supply terminal receiving an external power supply and the output signal having a voltage level of an internal power supply minus a predetermined voltage drop; a second pull-up transistor connected between an internal power supply terminal and the output terminal for increasing the voltage level of the output signal to the voltage level of the internal power supply responsive to a second control signal, the internal power supply terminal receiving the internal power supply; and a pull-down transistor connected between the output terminal and a ground terminal for providing a ground voltage to the output signal responsive to a third control signal, the ground terminal receiving the ground voltage.

The first pull-up transistor is an NMOS transistor having a drain connected to the external power supply terminal, a gate for receiving the first control signal, and a source connected to the output terminal. The pull-down transistor is an NMOS transistor having a drain connected to the output terminal, a gate for receiving the third control signal, and a source connected to the ground terminal. The second pull-up transistor is a PMOS transistor having a source connected to the internal power supply terminal, a gate for receiving the second control signal, and a drain connected to the output terminal. Alternatively, the second pull-up transistor is NMOS transistor having a drain connected to the internal power supply terminal, a gate for receiving the second control signal, and a source connected to the output terminal.

The signal line driver further includes a first inverter coupled between an input signal terminal and the pull-down transistor for generating the third control signal by inverting the input signal, the input signal terminal receiving the input signal; a second inverter coupled between the first inverter and the first pull-up transistor for generating the first control signal by inverting the third control signal; and a third inverter coupled between the second inverter and the second pull-up transistor for generating the second control signal by inverting the first control signal. The first, second, and third inverters are coupled to the internal power supply terminal for receiving the internal power supply. A fourth inverter is further included when the second pull-up transistor is an NMOS transistor. The fourth inverter is coupled between the third inverter and the second pull-up transistor and generates the second control signal by inverting the fourth control signal.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
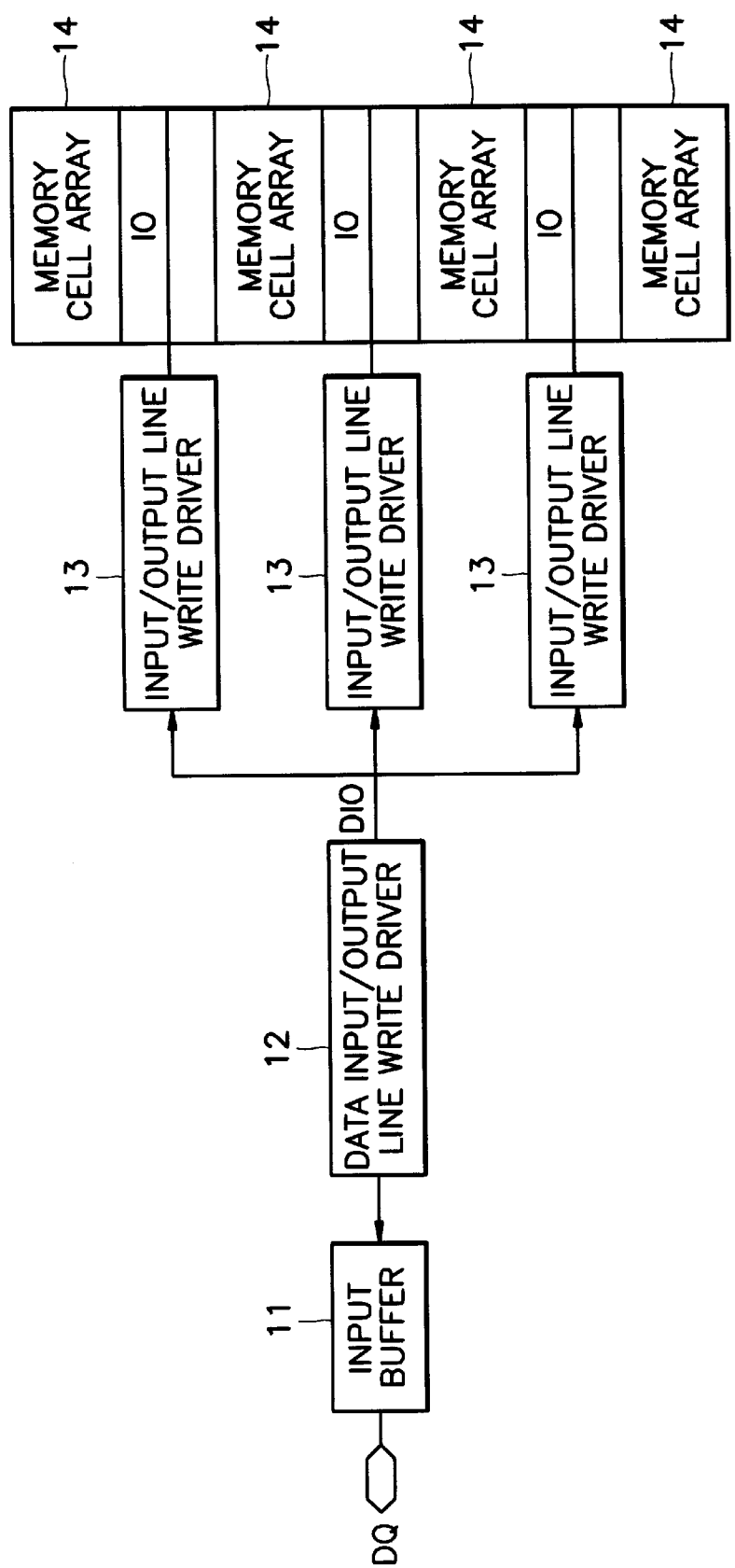
FIG. 1 is a block diagram of the write path of a typical semiconductor memory device.

Referring to FIG. 1, the write path of a typical semiconductor memory device includes an input buffer 11, a data input/output line write driver 12, a multiplicity of input/output line write drivers 13, and a multiplicity of memory cell arrays 14. The input buffer 11 receives an input signal through a data input/output pin DQ and buffers the received signal. The data input/output line write driver 12 receives the output signal of the input buffer 11 and drives a data input/output line DIO. The input/output line write drivers 13 receive signals transmitted through the data input/output line DIO, and each drive one of input/output lines IO. The memory cell arrays 14 store data transmitted through the input/output lines IO.

Figure 2:
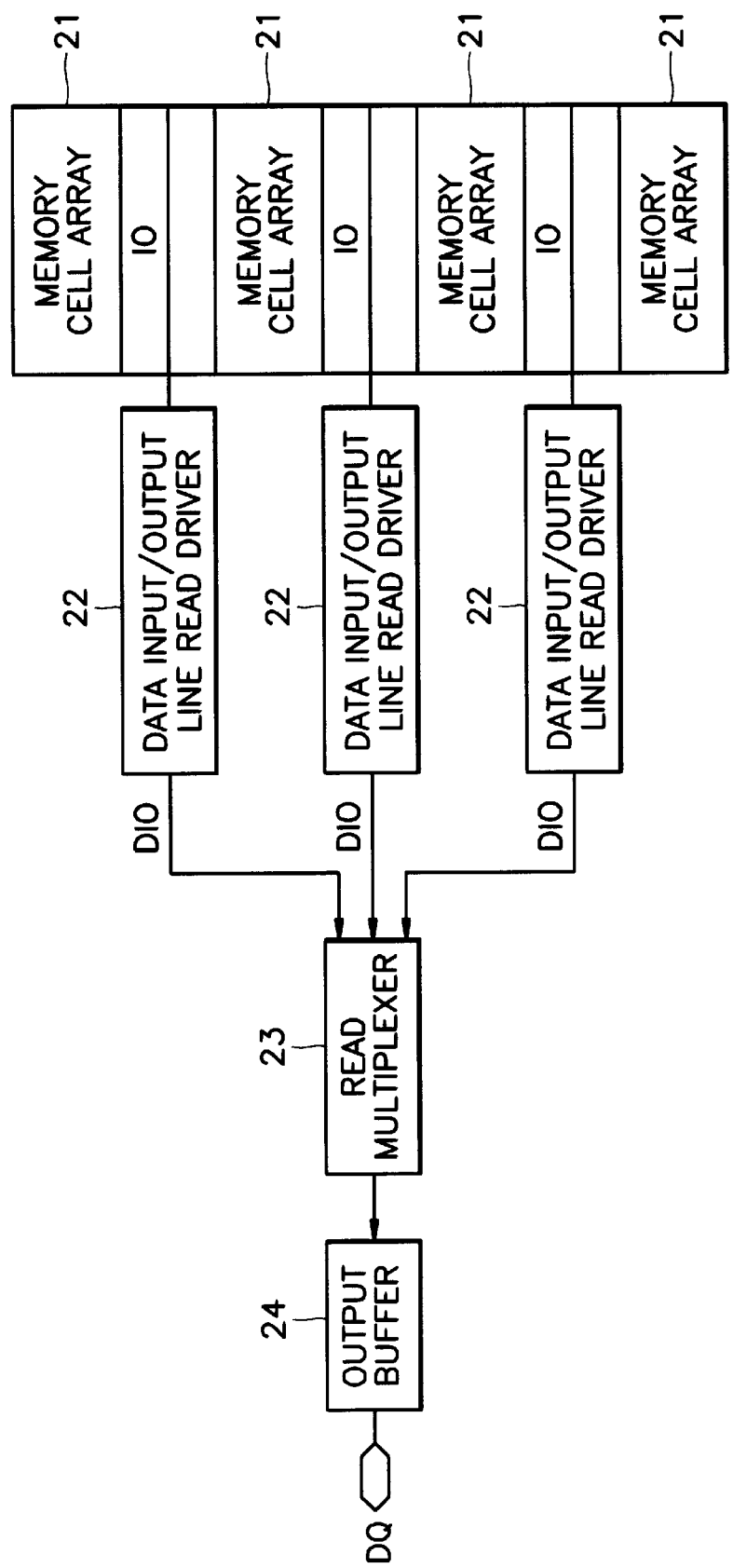
FIG. 2 is a block diagram of the read path of a typical semiconductor memory device.

Referring to FIG. 2, a read path of a typical semiconductor memory device includes a multiplicity of memory cell arrays 21, a multiplicity of data input/output line read drivers 22, a read multiplexer 23, and an output buffer 24. The memory cell arrays 21 store data. The data input/output line read drivers 22 receive data from the memory cell array 21 through respective input/output lines IO, to drive respective data input/output lines DIO. The read multiplexer 23 selects one of the signals transmitted through the data input/output lines DIO. The output buffer 24 buffers the output signals of the read multiplexer 23 and outputs the buffered signals through a data input/output pin DQ.

A typical high speed semiconductor memory device uses an externally supplied power supply voltage to power the data input/output line write driver 12, the input/output line write drivers 13, and the data input/output line read drivers 22. By doing so, the operating speed of the device increases. Alternatively, an internal power supply having a voltage lower than the external power supply voltage can be used to power the data input/output line write driver 12, the input/output line write drivers 13, and the data input/output line read drivers 22. The internal power supply voltage is generated using the external power supply by an internal power supply voltage generator included in the semiconductor memory device.

Power in the semiconductor memory device is consumed mainly by the write path shown in FIG. 1 and by the read path shown in FIG. 2. In the case of the write path shown in FIG. 1, a large amount of power is consumed by the data input/output line write driver 12 which drives the data input/output line DIO and by the input/output line write drivers 13 which drives the input/output lines IO. The data input/output lines DIO and the input/output lines IO are generally long and have a high load which results in the data input/output line write driver 12 and the input/output line write drivers 13 consuming more power. In the case of the read path shown in FIG. 2, a large amount of power is consumed by the data input/output line read drivers 22 which drives the long and heavily loaded data input/output lines DIO.

The multi-bit semiconductor memory device, having a multiplicity of data input/output lines DIO and input/output lines IO, which are simultaneously driven during a write or a read operation, has an increased number of data input/output line write drivers 12, input/output line write drivers 13, and data input/output line read drivers 22. The above-described configuration leads to increased power consumption. In particular, in the case of a high speed multi-bit synchronous DRAM, the external power supply voltage which is higher than the internal power supply voltage is supplied to the drivers 12, 13, and 22, to allow high speed operation. However, doing so, also increases power consumption.

Figure 3A:
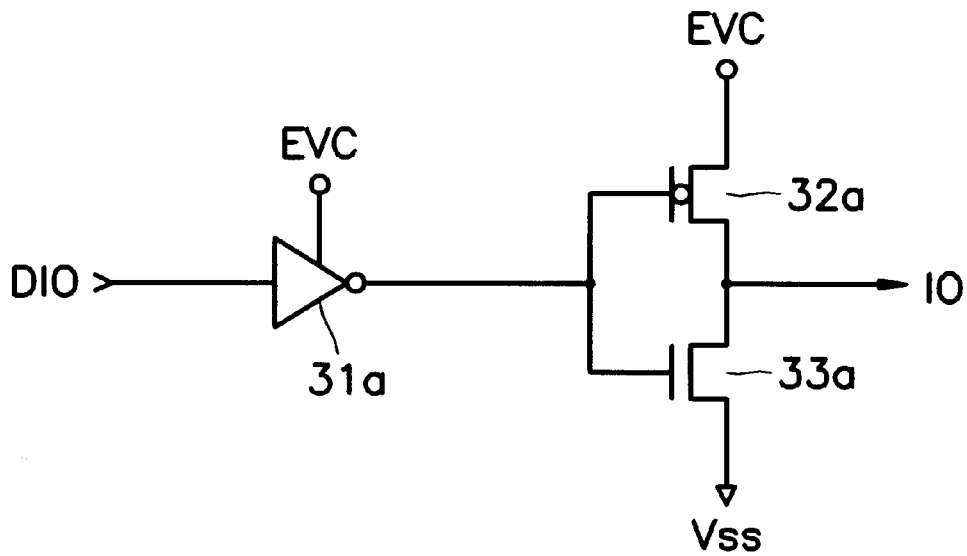
FIGS. 3A and 3B are circuit diagrams of conventional signal line drivers used as an input/output line write driver, a data input/output line write driver, and a data input/output line read driver for the semiconductor memory devices shown in FIGS. 1 and 2.
Figure 3B:
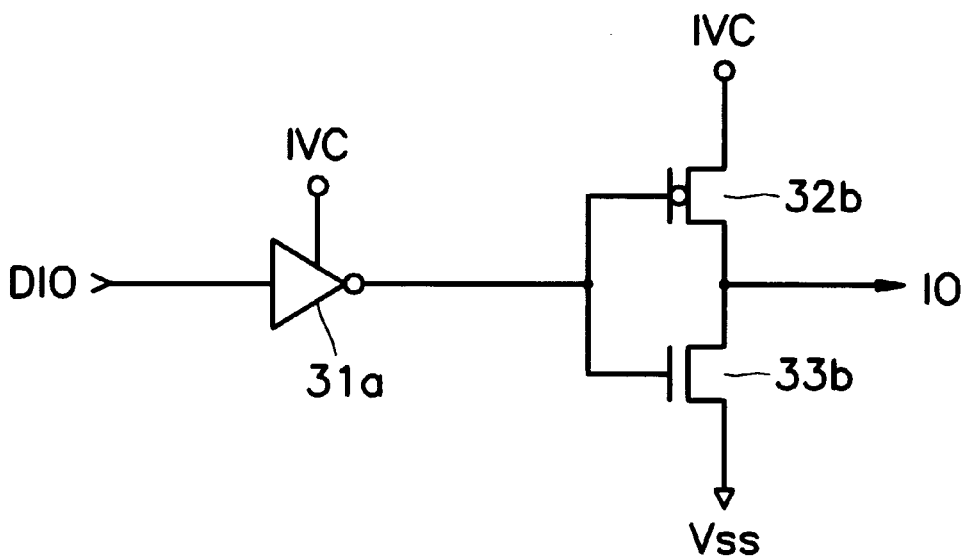

FIGS. 3A and 3B are circuit diagrams of conventional signal line drivers used as an input/output line write driver, a data input/output line write driver, and a data input/output line read driver for the semiconductor memory devices shown in FIGS. 1 and 2. In FIG. 3A, an external power supply voltage EVC is used as the primary power supply voltage and in FIG. 3B, an internal power supply voltage IVC is used as the primary power supply voltage.

Referring to FIG. 3A, a conventional signal line driver includes an inverter 31a, a PMOS pull-up transistor 32a, and an NMOS pull-down transistor 33a. The inverter 31a receives an external power supply voltage EVC at a power supply voltage terminal and inverts the DIO signal received at the data input/output line DIO of the semiconductor memory device shown in FIG. 1. The PMOS pull-up transistor 32a has a source for receiving the external power supply voltage EVC, a gate for receiving the output signal of the inverter 31a, and a drain connected to the input/output line IO of the semiconductor memory device shown in FIG. 1. Accordingly, the PMOS pull-up transistor 32a pulls up the input/output line IO to the level of the external power supply voltage EVC responsive to the output signal of the inverter 31a. The PMOS pull-up transistor 32a has a high current capability which allows it to drive the long and heavily loaded input/output line IO. For this reason, power is consumed primarily by the PMOS pull-up transistor 32a. The NMOS pull-down transistor 33a has a drain connected to the input/output line IO, a gate for receiving the output signal of the inverter 31a, and a source connected to a ground voltage VSS. Accordingly, the NMOS pull-down transistor pulls down the input/output line IO to the level of the ground voltage VSS responsive to the output signal of the inverter 31a. Therefore, the signal provided to the input/output line IO swings between the voltage level of the external power supply EVC and the voltage level of the ground voltage VSS.

As described above, the conventional signal line driver shown in FIG. 3A in which the external power supply EVC having a voltage level higher than that of the internal power supply IVC is used as the primary power supply is capable of operating at high speed at the expense of increasing power consumption.

Referring to FIG. 3B, a conventional signal line driver like the signal line driver shown in FIG. 3A, includes an inverter 31b, a PMOS pull-up transistor 32b, and an NMOS pull-down transistor 33b. The internal power supply IVC having a voltage level lower than that of the external power supply EVC is used as the primary power supply.

Accordingly, the PMOS pull-up transistor 32b pulls up the input/output line IO to the voltage level of the internal power supply IVC responsive to the output signal of the inverter 31b. The NMOS pull-down transistor 33b pulls down the input/output line IO to ground voltage VSS responsive to the output signal of the inverter 31b. Therefore, the signal provided to the input/output line IO swings between the voltage level of the internal power supply IVC and the voltage level of the ground voltage VSS.

The conventional signal line driver shown in FIG. 3B in which the internal power supply IVC having a voltage level lower than the voltage level of external power supply EVC is used as the primary power supply, reduces power consumption. However, the signal line driver shown in FIG. 3B does not operate at the desired high speeds.

Accordingly, it is an object of the present invention to provide a signal line driver which both operates at high speed and consumes minimal power. The signal line driver of the present invention is capable of driving a signal line, such as a data input/output line of a semiconductor memory device and an input/output line thereof, which is long and has a high load. It is another object of the present invention to provide a semiconductor memory device having a signal line driver which operates at high speed and consumes minimal power.

Figure 4:
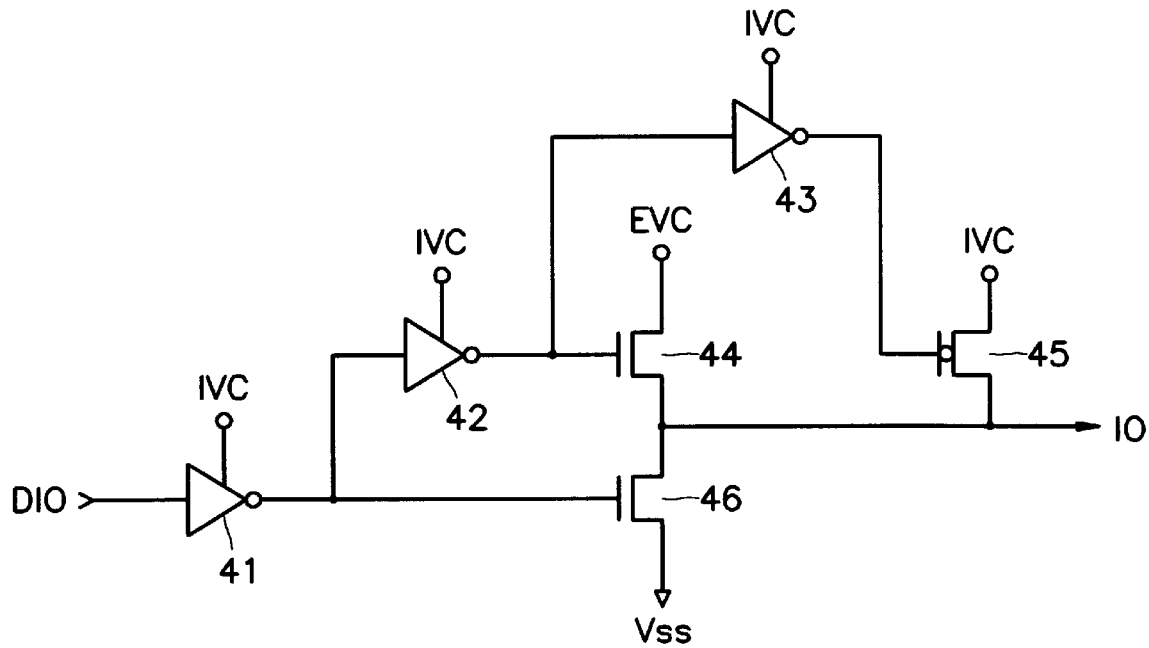
FIG. 4 is a circuit diagram of a signal line driver according to an embodiment of the present invention.

FIG. 4 is a circuit diagram of a signal line driver according to a first embodiment of the present invention. The signal line driver circuit shown in FIG. 4 is selectively used as the input/output line write driver, the data input/output line write driver, and the data input/output line read driver of FIGS. 1 and 2. The signal line driver shown in FIG. 4 is capable of driving signal lines which are long and heavily loaded.

Referring to FIG. 4, the signal line driver includes a first inverter 41, a second inverter 42, a third inverter 43, a first pull-up unit 44, a second pull-up unit 45, and a pull-down unit 46. The first inverter 41 receives an internal power supply IVC and inverts the signal received from an input terminal DIO. The second inverter 42 likewise receives the internal power supply IVC and inverts the output signal of the first inverter 41. The third inverter 43 receives the internal power supply IVC and inverts the output signal of the second inverter 42. Accordingly, the output signals of the first inverter 41, the second inverter 42, and the third inverter 43 swing between the voltage level of the internal power supply IVC and ground voltage VSS. At least one first pull-up unit 44 is connected between the external power supply EVC having a voltage level higher than the voltage level of the internal power supply IVC and the output terminal IO. The first pull-up unit 44 includes a control terminal for receiving the output signal of the second inverter 42. The first pull-up unit 44 pulls the output terminal IO to the voltage level of the external power supply EVC responsive to the output signal of the inverter 42. At least one second pull-up unit 45 is connected between the internal power supply IVC and the output terminal IO. The second pull-up unit 45 includes a control terminal for receiving the output signal of inverter 43. The second pull-up unit 45 pulls the output terminal IO to the voltage level of the internal power supply IVC responsive to the output signal of the inverter 43. At least one pull-down unit 46 is connected between the output terminal IO and the ground voltage VSS. The pull-down unit 46 includes a control terminal for receiving the output signal of the first inverter 41. The pull-down unit 46 pulls the signal present at output terminal IO to ground voltage VSS. In FIG. 4, only a single first pull-up unit 44 and a single second pull-up unit 45 are shown. However, several first pull-up units 44 and several second pull-up units 45 can be used. The output terminal IO is connected to a signal line which is long and has a high load, like the input/output line IO of the semiconductor memory device shown in FIG. 1.

Each of the first inverter 41, the second inverter 42, and the third inverter 43 may comprise inverters or other logic gates. The first pull-up unit 44 comprises an NMOS transistor having a drain connected to the external power supply EVC, a gate for receiving the output signal of the second inverter 42, and a source connected to the output terminal IO. The second pull-up unit 45 comprises a PMOS transistor having a source connected to the internal power supply IVC, a gate for receiving the output signal of the third inverter 43, and a drain connected to the output terminal IO. The NMOS transistor of the first pull-up unit 44 has high current capabilities for driving a signal line which is long, has a high load, and is connected to the output terminal IO. However, the PMOS transistor of the second pull-up unit 45 has low current capabilities. In general, power is consumed primarily by the NMOS transistor of the first pull-up unit 44 and the PMOS transistor of the second pull-up unit 45. The pull-down unit 46 comprises an NMOS transistor having a drain connected to the output terminal IO, a gate for receiving the output signal of the first inverter 41, and a source connected to the ground voltage VSS. The operation of the signal line driver of FIG. 4 is described below.

When a logic low signal is received at the input terminal DIO, i.e., the data input/output line DIO of the semiconductor memory device shown in FIG. 1, each of the output signals of the first and third inverters 41 and 43 are at a logic high, i.e., at the voltage level of the internal power supply IVC. Therefore, the first and second pull-up units 44 and 45 are turned off and the pull-down unit 46 is turned on. The output terminal IO and the signal line connected to the output terminal IO are pulled down to the ground voltage VSS.

When a logic high signal is received at the input terminal DIO, each of the output signals of the first and third inverters 41 and 43 are at a logic low. Also, the output signal of the second inverter 42 is logic high, i.e., at the voltage level of the internal power supply IVC. Therefore, the first pull-up unit 44 is turned on responsive to the output signal of the second inverter 42 which is at the voltage level of the internal power supply IVC. Thus, the voltage of the output terminal IO becomes IVC-Vt, where Vt indicates the threshold voltage of the NMOS transistor of the first pull-up unit 44. The second pull-up unit 45 is turned on, responding to the logic low output signal of the third inverter 43, to increase the voltage of the output terminal IO to the voltage level of the internal power supply IVC. As described above, the driver circuit is designed such that the NMOS transistor of the first pull-up unit 44 has high current capabilities and the PMOS transistor of the second pull-up unit 45 has low current capabilities. Accordingly, the first pull-up unit 44 which receives the external power supply voltage EVC supplies the current for driving a signal line connected to the output terminal IO and the second pull-up unit 45 which receives the internal power supply IVC increases the voltage of the signal line connected to the output terminal IO from IVC-Vt to IVC.

Accordingly, the voltage of the signal line connected to the output terminal IO first increases to the IVC-Vt voltage level by the first pull-up unit 44 using the external power supply EVC which has a voltage level higher than that of the internal power supply IVC. Thereafter, the second pull-up unit 45 using the internal power supply IVC increases the voltage of the signal line connected to the output terminal IO from the IVC-Vt level to the internal power supply IVC level. By driving the signal line in this manner, power consumption due to the internal power supply IVC is minimized. That is, the signal line driver shown in FIG. 4 operates at high speed and consumes minimal power.

Figure 5:
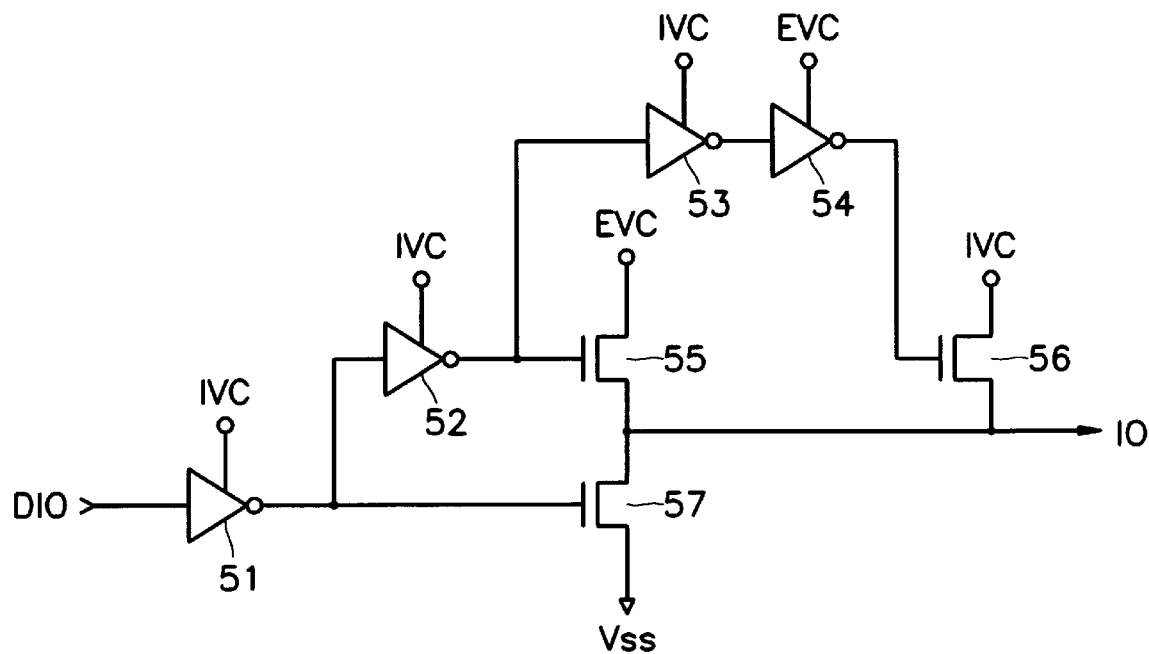
FIG. 5 is a circuit diagram of a signal line driver according to a second embodiment of the present invention.

FIG. 5 is a circuit diagram of a signal line driver according to a second embodiment of the present invention. The circuit of the second embodiment may be selectively used for the input/output line write driver, the data input/output line write driver, and the data input/output line read driver of the semiconductor memory device shown in FIGS. 1 and 2. The circuit shown in FIG. 5 can drive any signal lines which are long and have a high load.

Referring to FIG. 5, the signal line driver includes a first inverter 51, a second inverter 52, a third inverter 53, a fourth inverter 54, a first pull-up unit 55, a second pull-up unit 56, and a pull-down unit 57.

The first inverter 51 receives the first power supply voltage, i.e., an internal power supply IVC, as its primary power source and inverts the signal received from an input terminal DIO. The second inverter 52 receives the internal power supply IVC and inverts the output signal of the first inverter 51. The third inverter 53 receives the internal power supply IVC and inverts the output signal of the second inverter 52. The fourth inverter 54 receives a second power supply voltage having a voltage level higher than that of the internal power supply IVC, i.e., an external power supply EVC, as its primary power source and inverts the output signal of the third inverter 53. Accordingly, the output signals of the first, second, and third inverters 51, 52, and 53, respectively, swing between the voltage level of the internal power supply IVC and the ground voltage VSS. The output signal of the fourth inverter 54 swings between the voltage level of the external power supply EVC and the ground voltage VSS. At least one first pull-up unit 55 is connected between the external power supply EVC and an output terminal IO. The first pull-up unit 55 includes a control terminal for receiving the output signal of the inverter 52. The first pull-up unit 55 pulls up the voltage at the output terminal IO responsive to the output signal of the inverter 42. At least one second pull-up unit 56 is connected between the internal power supply IVC and the output terminal IO. The second pull-up unit 56 includes a control terminal for receiving the output signal of the fourth inverter 54. The second pull-up unit 56 pulls up the voltage at the output terminal IO. At least one pull-down unit 57 is connected between the output terminal IO and the ground voltage VSS. The pull-down unit 57 includes a control terminal for receiving the output signal of the first inverter 51. The pull-down unit 57 pulls down the voltage at the output terminal IO responsive to the output signal of the first inverter 51. In FIG. 5, a single first pull-up unit 55 and a single second pull-up unit 56 are shown. However, more than a single first and second pull-up units 55 and 56, respectively, can be used. The output terminal IO is connected to a signal line which is long and has a high load, like the input/output line IO of the semiconductor memory device shown FIG. 1.

Each of the first inverter 51, the second inverter 52, the third inverter 53, and the fourth inverter 54 comprises inverters or other logic gates. The first pull-up unit 55 comprises an NMOS transistor having a drain connected to the external power supply EVC, a gate for receiving the output signal of the second inverter 52, and a source connected to the output terminal IO. The second pull-up unit 56 comprises an NMOS transistor having a drain connected to the internal power supply IVC, a gate for receiving the output signal of the fourth inverter 54, i.e., a signal whose voltage level swings between the voltage level of the external power supply EVC and the ground voltage VSS, and a source connected to the output terminal IO. The gate of the second pull-up unit 56 receives the output signal of the fourth inverter 54 and avoids the voltage drop of the NMOS transistor. In particular, the NMOS transistor of the first pull-up unit 55 is designed such that it has a high current capability for driving the signal line connected to the output terminal IO and the NMOS transistor of the second pull-up unit 56 is designed such that it has a low current capability. In general, power is consumed primarily by the NMOS transistors of the first pull-up unit 55 and the second pull-up unit 56. The pull-down unit 57 comprises an NMOS transistor having a drain connected to the output terminal IO, a gate for receiving the output signal of the first inverter 51, and a source connected to the ground voltage VSS.

The operation of the signal line driver of FIG. 5 is as follows. When a logic low signal is received at the input terminal DIO, i.e., the data input/output line DIO of the semiconductor memory device shown in FIG. 1, each of the output signals of the first inverter 51 and the third inverter 53 are at a logic high, i.e., at the voltage level of the internal power supply IVC. The output signals of the second and fourth inverters 52 and 54 are at a logic low. Accordingly, the first pull-up unit 55 and the second pull-up unit 56 are turned off, and the pull-down unit 57 is turned on. The output terminal IO and the signal line connected to the output terminal IO are pulled down to the ground voltage VSS.

When a logic high signal is received at the input terminal DIO, each of the output signals of the first and third inverters 51 and 53 are at a logic low. The output signal of the second inverter 52 is at a logic high, i.e., at the voltage level of the internal power supply IVC and the output signal of the fourth inverter 54 is at a logic high, i.e., at the voltage level of the external power supply EVC. Accordingly, the first pull-up unit 55 is turned on responsive to the output signal of the second inverter 52 which has the voltage level of the internal power supply IVC. Thus, the voltage of the output terminal IO becomes IVC-Vt, where Vt indicates the threshold voltage of the NMOS transistor of the first pull-up unit 55. Thereafter, the second pull-up unit 56 is turned on responsive to the output signal of the fourth inverter 54 which is at the voltage level of the external power supply EVC such that the voltage of the output terminal IO increases to IVC. The voltage level of the external power supply EVC applied to the gate of the NMOS transistor of the second pull-up unit 56 is higher than the voltage level of the internal power supply IVC and, thus, is higher than the threshold voltage of the NMOS transistor of the second pull-up unit 56. Therefore, the voltage level of the output terminal IO increases to the voltage level of the internal power supply IVC without the voltage drop of the second pull-up unit 56.

As described above, in the signal line driver shown in FIG. 5, like the signal line driver shown in FIG. 4, the first pull-up unit 55 supplies the current for driving the signal line connected to the output terminal IO and the second pull-up unit 56 increases the voltage level of the signal line connected to the output terminal IO from IVC-Vt to IVC.

Accordingly, in the signal line driver shown in FIG. 5, the signal line connected to the output terminal IO of the signal line driver first increases to the IVC-Vt level by the first pull-up unit 55 using the external power supply EVC having a voltage level higher than that of the internal power supply IVC. Thereafter, the second pull-up unit 56 using the internal power supply IVC increases the voltage level of the signal line connected to the output terminal IO from IVC-Vt to IVC. By driving the signal line in this manner, power consumption due to the internal power supply IVC is minimized, That is, the signal line driver shown in FIG. 5 operates at high speed and consumes minimal power.

Figure 6:
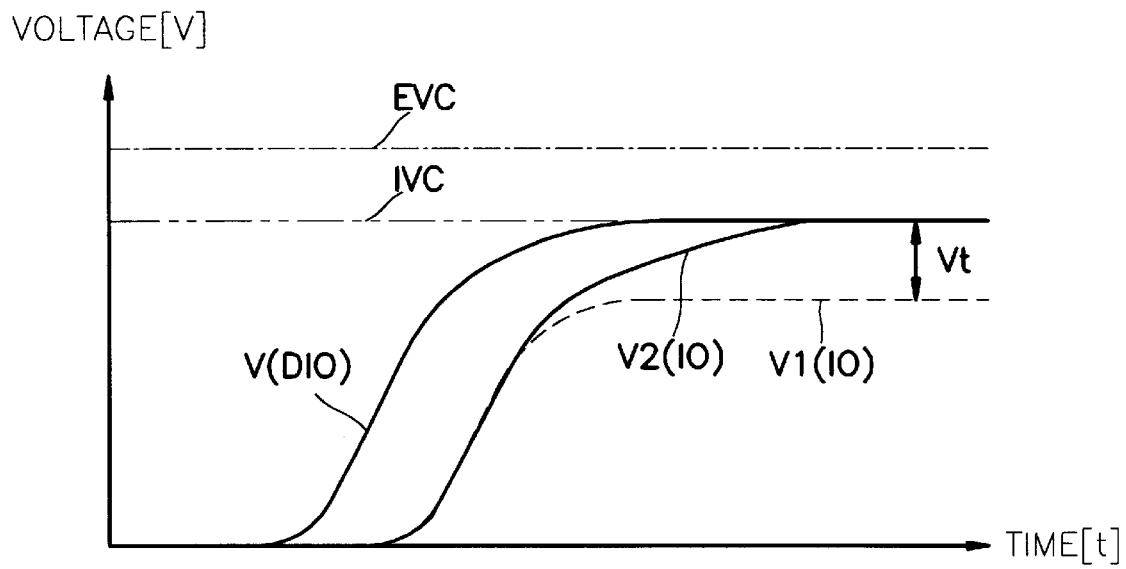
FIG. 6 is a timing diagram of the signal line drivers shown in FIGS. 4 and 5.

FIG. 6 is a timing diagram of the signal line drivers shown in FIG. 4. In FIG. 6, reference character EVC indicates the external power supply, reference character IVC indicates the internal power supply, reference character V(DIO) indicates the signal received at the input terminal DIO of the signal line driver, reference character VI (10) indicates the signal output from the output terminal IO of the signal line driver where the second pull-up unit 45 or 56 is not included in the signal line driver, and reference character V2(IO) indicates a signal output from the output terminal IO of the signal line driver where the second pull-up unit 45 or 56 is included in the signal line driver.

Referring to FIG. 6, where the second pull-up unit 45 or 56 is not included in the signal line driver, the signal V1(IO) increases to IVC-Vt by the first pull-up unit 44. However, where the second pull-up unit 45 or 56 is included in the signal line driver, the signal V2(IO) increases to IVC-Vt by the first pull-up unit 44 and then increases to IVC by the second pull-up unit 45.

Figure 7:
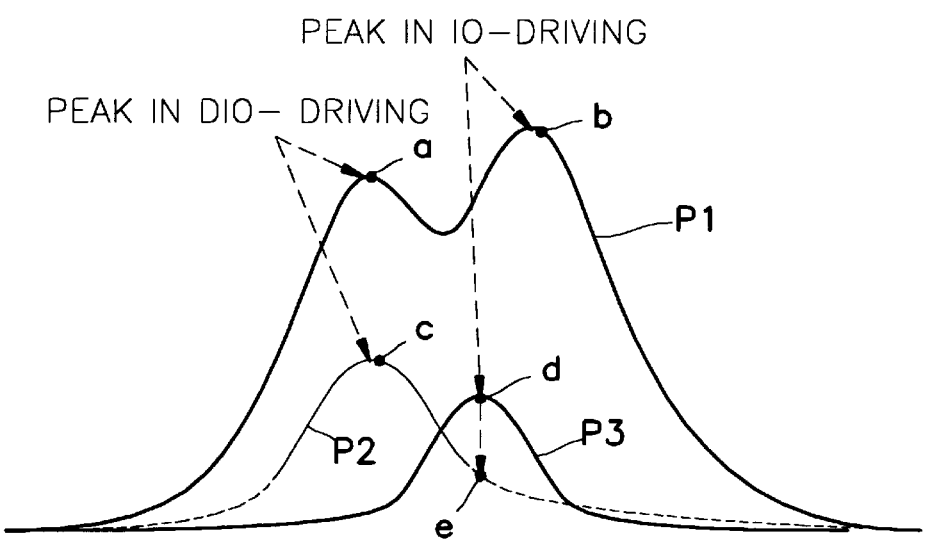
FIG. 7 is a diagram comparing the peak current occurring during a write operation using a conventional signal line driver and using a signal line driver according to the present invention as a data input/output line write driver and an input/output line write driver of the semiconductor memory device shown in FIG. 1.

FIG. 7 shows peak current consumption during a write operation when a conventional signal line driver and a signal line driver according to the present invention are used as the data input/output line write driver and as the input/output line write driver for the semiconductor memory device shown in FIG. 1.

In FIG. 7, P1 shows peak current consumption of the external power supply EVC when the conventional signal line driver shown in FIG. 3A is used for both the data input/output line write driver 12 and the input/output line write driver 13 of the semiconductor memory device shown in FIG. 1, P2 and P3 show respective peak currents of the internal power supply IVC and the external power supply EVC when the signal line driver according to the present invention is used for the input/output line write driver 13 and the conventional signal line driver is used as the data input/output line write driver 12.

Referring to FIG. 7, the sum of peak currents P2 and P3 when the signal line driver according to the present invention is used is less than the peak current P1 when the conventional signal line driver is used. In the signal line driver according to the present invention, in which the internal power supply IVC and the external power supply EVC are used, the peak currents P2 and P3 flow through the circuit. In the conventional signal line driver, in which only external power supply voltage EVC is used, peak current P1 of the external power supply voltage EVC flows through the circuit. Point 'a' of P1 and point 'c' of P2 show peak current consumption when the data input/output line write driver 12 drives the data input/output line DIO connected to the output terminal of the data input/output line write driver 12. Points 'b', 'd', and 'e' of P1, P3, and P2 show peak current when the input/output line write driver 13 drives the input/output line IO connected to the output terminal of the input/output line write driver 13.

As described above, the signal line drivers shown in FIGS. 4 and 5 operate at a high speed and consume minimal power. Accordingly, in the case that the signal line drivers are selectively employed as the data input/output line write driver, the input/output line write driver, and the data input/output line read driver of the semiconductor memory devices such as those shown in FIGS. 1 and 2 or as the driver for any signal line which is long and has a high load, in particular, in a multi-bit semiconductor memory device, the semiconductor memory device has reduced power consumption and operates at high speed.

In summary, the signal line driver according to the present invention operates at high speed and reduces power consumption and, thus, a semiconductor memory device employing the same also operates at high speed and reduces power consumption.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A signal line driver for driving a signal line connected to an output terminal in a semiconductor memory device, comprising:

a first pull-up transistor connected between an external power supply terminal and the output terminal for providing an output signal to the output terminal responsive to a first control signal, the external power supply terminal receiving an external power supply and the output signal having a voltage level of an internal power supply minus a predetermined voltage drop;

a second pull-up transistor connected between an internal power supply terminal and the output terminal for increasing the voltage level of the output signal to the voltage level of the internal power supply responsive to a second control signal, the internal power supply terminal receiving the internal power supply; and a pull-down transistor connected between the output terminal and a ground terminal for providing a ground voltage to the output signal responsive to a third control signal, the ground terminal receiving the ground voltage.

2. The signal line driver of claim 1 wherein the first pull-up transistor is an NMOS transistor having a drain connected to the external power supply terminal, a gate for receiving the first control signal, and a source connected to the output terminal.

3. The signal line driver of claim 2 wherein the pull-down transistor is an NMOS transistor having a drain connected to the output terminal, a gate for receiving the third control signal, and a source connected to the ground terminal.

4. The signal line driver of claim 3 wherein the second pull-up transistor is a PMOS transistor having a source connected to the internal power supply terminal, a gate for receiving the second control signal, and a drain connected to the output terminal.

5. The signal line driver of claim 4 including:

a first inverter coupled between an input signal terminal and the pull-down transistor for generating the third control signal by inverting the input signal, the input signal terminal receiving the input signal;

a second inverter coupled between the first inverter and the first pull-up transistor for generating the first control signal by inverting the third control signal; and a third inverter coupled between the second inverter and the second pull-up transistor for generating the second control signal by inverting the first control signal.

6. The signal line driver of claim 5 wherein the first, second, and third inverters are coupled to the internal power supply terminal for receiving the internal power supply.

7. The signal line driver of claim 3 wherein the second pull-up transistor is an NMOS transistor having a drain connected to the internal power supply terminal, a gate for receiving the second control signal, and a source connected to the output terminal.

8. The signal line driver of claim 7 comprising:

a first inverter coupled between an input signal terminal and the pull-down transistor for generating the third control signal by inverting the input signal, the input signal terminal receiving the input signal;

a second inverter coupled between the first pull-up transistor and the first inverter for generating the first control signal by inverting the third control signal;

a third inverter coupled to the second inverter for generating a fourth control signal by inverting the first control signal; and a fourth inverter coupled between the third inverter and the second pull-up transistor for generating the second control signal by inverting the fourth control signal.

9. The signal line driver of claim 8 wherein the first, second, third, and fourth inverters are connected to the internal power supply terminal for receiving the internal power supply.

10. The signal line driver of claim 1 wherein the voltage level of the internal power supply is less than a voltage level of the external power supply.

11. The signal line driver of claim 1 wherein the internal power supply is generated internally by the semiconductor memory device by reducing a voltage level of the external power supply.

12. The signal line driver of claim 1 wherein the first control signal is an inverted version of the third control signal and the second control signal is an inverted version of the first control signal.

13. The signal line driver of claim 1 wherein the signal line is an input/output line of a semiconductor memory device for transmitting data from and into a memory cell array.

14. A signal line driver for driving a signal line connected to an output terminal in a semiconductor memory device, comprising:

at least one first pull-up transistor coupled between an external power supply terminal and the output terminal for providing an output signal to the output terminal responsive to a first control signal, the external power supply terminal receiving an external power supply and the output signal having a voltage level of the internal power supply minus a predetermined voltage drop;

at least one second pull-up transistor coupled between an internal power supply terminal and the output terminal for increasing the voltage level of the output signal to a voltage level of an internal power supply responsive to a second control signal, the internal power supply terminal receiving the internal power supply; and at least one pull-down transistor coupled between a ground terminal and the output terminal for providing a ground voltage to the output signal responsive to a third control signal, the ground terminal receiving the ground voltage;

a first inverter coupled to the at least one pull-down transistor for generating the third control signal by inverting an input signal;

a second inverter coupled between the first inverter and the at least one first pull-up transistor for generating the first control signal by inverting the third control signal; and a third inverter coupled between the second inverter and the at least one second pull-up transistor for inverting the first control signal.

15. The signal line driver of claim 14 wherein the at least one first pull-up transistor is an NMOS transistor having a drain connected to the external power supply terminal, a gate connected to the second inverter, and a source connected to the output terminal.

16. The signal line driver of claim 15 wherein the at least one pull-down transistor is an NMOS transistor having a drain connected to the output terminal, a gate connected to the first inverter, and a source connected to the ground terminal.

17. The signal line driver of claim 16 wherein the at least one second pull-up transistor is a PMOS transistor having a source connected to the internal power supply terminal, a gate connected to the third inverter, and a drain connected to the output terminal and wherein the third inverter generates the second control signal by inverting the first control signal.

18. The signal line driver of claim 16 including a fourth inverter coupled between the third inverter and the at least one second pull-up transistor for generating the second control signal by inverting an output signal of the third inverter.

19. The signal line driver of claim 18 wherein the at least one second pull-up transistor is an NMOS transistor having a drain connected to the internal power supply terminal, a gate connected to the fourth inverter, and a source connected to the output terminal.

20. The signal line driver of claim 14 wherein the external power supply is externally received by the semiconductor memory device and wherein the semiconductor memory device includes an internal power supply generator for generating the internal power supply from the external power supply.

21. The signal line driver of claim 14 wherein the signal line is an input/output line for transmitting data of a memory cell array of the semiconductor memory device.

22. A signal line driver for driving a signal line connected to an output terminal in a semiconductor memory device, comprising:

a first pull-up transistor having a first pull-up transistor channel connected between an external power supply input terminal and the output terminal for providing an output signal to the output terminal responsive to a first control signal, the output signal having a voltage level swing between a voltage level of an internal power supply minus a predetermined voltage drop and ground, the external power supply input terminal receiving an external power supply;

a second pull-up transistor having a second pull-up transistor channel connected between an internal power supply input terminal and the output terminal for increasing the voltage level of the output signal to the voltage level of the internal power supply responsive to a second control signal, the internal power supply input terminal receiving the internal power supply; and a pull-down transistor having a pull-down transistor channel connected between the output terminal and a ground terminal for providing the output terminal with a ground voltage responsive to a third control signal, the ground terminal receiving the ground voltage.

23. The signal line driver of claim 22 wherein a voltage level of the external power supply is higher than the voltage level of the internal power supply.

24. The signal line driver of claim 22 wherein the signal line is an input/output line for transmitting data from or into a memory cell array of the semiconductor memory device.

25. The signal line driver of claim 22 wherein the first pull-up transistor is an NMOS transistor having a drain connected to the external power supply input terminal, a gate for receiving the first control signal, and a source connected to the output terminal.

26. The signal line driver of claim 22 wherein the second pull-up transistor is an NMOS transistor having a drain connected to the internal power supply input terminal, a gate for receiving the second control signal, and a source connected to the output terminal.

27. The signal line driver of claim 22 wherein the second pull-up transistor is an PMOS transistor having a source connected to the internal power supply input terminal, a gate for receiving the second control signal, and a drain connected to the output terminal.

28. The signal line driver of claim 22 wherein the pull-down transistor is an NMOS transistor having a drain connected to the output terminal, a gate for receiving the third control signal, and a source connected to the ground terminal.

29. A semiconductor memory device, comprising:

an input buffer for receiving an input signal;

a data input/output line write driver coupled to the input buffer for driving a data input/output line;

an input/output line write driver coupled to the data input/output line for driving an input/output line;

a memory cell array for storing data transmitted through the input/output line;

a data input/output line read driver for receiving the data transmitted from the memory cell array and driving the data input/output line;

an output buffer for receiving the data transmitted through the data input/output line, buffering the received data, and providing the buffered data to an output buffer output terminal;

wherein at least one selected from the group consisting of the data input/output line write driver, the input/output line write driver, and the data input/output line read driver comprises:

at least one first pull-up transistor coupled between an external power supply terminal and the output terminal for providing an output signal to the output terminal responsive to a first control signal, the external power supply terminal receiving an external power supply and the output signal having a voltage level of the internal power supply minus a predetermined voltage drop;

at least one second pull-up transistor coupled between an internal power supply terminal and the output terminal for increasing the voltage level of the output signal to a voltage level of an internal power supply responsive to a second control signal, the internal power supply terminal receiving the internal power supply; and at least one pull-down transistor coupled between a ground terminal and the output terminal for providing a ground voltage to the output signal responsive to a third control signal, the ground terminal receiving the ground voltage;

a first inverter coupled to the at least one pull-down transistor for generating the third control signal by inverting the input signal;

a second inverter coupled between the first inverter and the at least one first pull-up transistor for generating the first control signal by inverting the third control signal; and a third inverter coupled between the second inverter and the at least one second pull-up transistor for inverting the first control signal.

30. The semiconductor memory device of claim 29 wherein the at least one first pull-up transistor is an NMOS transistor having a drain connected to the external power supply terminal, a gate connected to the second inverter, and a source connected to the output terminal.

31. The semiconductor memory device of claim 30 wherein the at least one pull-down transistor is an NMOS transistor having a drain connected to the output terminal, a gate connected to the first inverter, and a source connected to the ground terminal.

32. The semiconductor memory device of claim 31 wherein the at least one second pull-up transistor is a PMOS transistor having a source connected to the internal power supply terminal, a gate connected to the third inverter, and a drain connected to the output terminal and wherein the third inverter generates the second control signal by inverting the first control signal.

33. The semiconductor memory device of claim 31 including a fourth inverter coupled between the third inverter and the at least one second pull-up transistor for generating the second control signal by inverting an output signal of the third inverter.

34. The semiconductor memory device of claim 33 wherein the at least one second pull-up transistor is an NMOS transistor having a drain connected to the internal power supply terminal, a gate connected to the fourth inverter, and a source connected to the output terminal.

35. The semiconductor memory device of claim 29 wherein the external power supply is externally received by the semiconductor memory device and wherein the semiconductor memory device includes an internal power supply generator for generating the internal power supply from the external power supply.

36. The semiconductor memory device of claim 29 wherein each of the data input/output line write driver, the input/output line write driver, and the data input/output line read driver comprises:

at least one first pull-up transistor coupled between an external power supply terminal and the output terminal for providing an output signal to the output terminal responsive to a first control signal, the external power supply terminal receiving an external power supply and the output signal having a voltage level of the internal power supply minus a predetermined voltage drop;

at least one second pull-up transistor coupled between an internal power supply terminal and the output terminal for increasing the voltage level of the output signal to a voltage level of an internal power supply responsive to a second control signal, the internal power supply terminal receiving the internal power supply; and at least one pull-down transistor coupled between a ground terminal and the output terminal for providing a ground voltage to the output signal responsive to a third control signal, the ground terminal receiving the ground voltage;

a first inverter coupled to the at least one pull-down transistor for generating the third control signal by inverting the input signal;

a second inverter coupled between the first inverter and the at least one first pull-up transistor for generating the first control signal by inverting the third control signal; and a third inverter coupled between the second inverter and the at least one second pull-up transistor for inverting the first control signal.

* * * * *

UNITED STATES PATENT AND TRADEMARK OFFICE
CERTIFICATE OF CORRECTION

PATENT NO. : 5,936,896 Page 1 of 1
DATED : August 10, 1999
INVENTOR(S) : Il-jae Cho and Jin-man Han It is certified that error appears in the above-identified patent and that said Letters Patent is hereby corrected as shown below:

Column 9,
Line 3, "V1(10)" should read -- V1 (IO) --

Signed and Sealed this

Fourth Day of June, 2002

Attest:

Attesting Officer

JAMES E. ROGAN
Director of the United States Patent and Trademark Office